(12) United States Patent
Yoo et al.

(10) Patent No.: US 10,840,229 B2
(45) Date of Patent: Nov. 17, 2020

(54) GRAPHICS PROCESSING UNIT AND HIGH BANDWIDTH MEMORY INTEGRATION USING INTEGRATED INTERFACE AND SILICON INTERPOSER

(71) Applicant: Micron Technology, Inc., Boise, ID (US)

(72) Inventors: Chan H. Yoo, Boise, ID (US); Owen R. Fay, Boise, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 16/180,361

(22) Filed: Nov. 5, 2018

(65) Prior Publication Data

US 2020/0144241 A1 May 7, 2020

(51) Int. Cl.
| | | |
|---|---|---|
| *H01L 25/18* | (2006.01) | |
| *H01L 25/00* | (2006.01) | |
| *H01L 23/00* | (2006.01) | |
| *H01L 23/522* | (2006.01) | |
| *H01L 23/48* | (2006.01) | |

(52) U.S. Cl.
CPC .............. *H01L 25/18* (2013.01); *H01L 24/16* (2013.01); *H01L 25/50* (2013.01); *H01L 23/481* (2013.01); *H01L 23/522* (2013.01); *H01L 2224/16145* (2013.01); *H01L 2924/1431* (2013.01); *H01L 2924/1432* (2013.01); *H01L 2924/1436* (2013.01)

(58) Field of Classification Search
CPC ......... H01L 25/18; H01L 25/50; H01L 24/16; H01L 2924/1432; H01L 2224/16145; H01L 2924/1436; H01L 2924/1431; H01L 23/481; H01L 25/043; H01L 25/0657; H01L 25/074; H01L 25/0756; H01L 25/117; H01L 21/4803–481; H01L 21/52; H01L 33/486; H01L 39/04–045; H01L 23/522–5389
See application file for complete search history.

(56) References Cited

U.S. PATENT DOCUMENTS

| | | | |
|---|---|---|---|
| 7,745,915 B2 * | 6/2010 | Suwa ...................... | H01L 23/50 257/678 |
| 9,425,159 B2 * | 8/2016 | Terui ...................... | H01L 24/19 |

(Continued)

*Primary Examiner* — Cuong B Nguyen
(74) *Attorney, Agent, or Firm* — Parsons Behle & Latimer

(57) ABSTRACT

A semiconductor device assembly that includes first and second semiconductor devices connected directly to a first side of a substrate and a plurality of interconnects connected to a second side of the substrate. The substrate is configured to enable the first and second semiconductor devices to communicate with each other through the substrate. The substrate may be a silicon substrate that includes complementary metal-oxide-semiconductor (CMOS) circuits. The first semiconductor device may be a processing unit and the second semiconductor device may be a memory device, which may be a high bandwidth memory device. A method of making a semiconductor device assembly includes applying CMOS processing to a silicon substrate, forming back end of line (BEOL) layers on a first side of the substrate, attaching a memory device and a processing unit directly to the BEOL layers, and forming a redistribution layer on the second side of the substrate.

16 Claims, 4 Drawing Sheets

(56) References Cited

U.S. PATENT DOCUMENTS

| | | | |
|---|---|---|---|
| 2012/0018876 A1* | 1/2012 | Wu | H01L 21/6835 |
| | | | 257/737 |
| 2014/0264791 A1* | 9/2014 | Manusharow | H01L 25/0655 |
| | | | 257/666 |
| 2015/0340303 A1* | 11/2015 | Oh | H01L 21/486 |
| | | | 257/692 |
| 2016/0268182 A1* | 9/2016 | Lee | H01L 23/5384 |
| 2018/0138101 A1* | 5/2018 | Yu | H01L 24/73 |

* cited by examiner

GRAPHICS PROCESSING UNIT AND HIGH BANDWIDTH MEMORY INTEGRATION USING INTEGRATED INTERFACE AND SILICON INTERPOSER

FIELD

The embodiments described herein relate to semiconductor device assemblies and methods of making semiconductor device assemblies having a processing unit and a memory device directly connected to a substrate, which may be a silicon substrate that enables the semiconductor device assembly to be connected to another device, such as a graphics card. The substrate may include complementary metal-oxide-semiconductor (CMOS) circuits. The processing unit may be a graphics processing unit (GPU) or central processing unit (CPU) and the memory device may be a high bandwidth memory device.

BACKGROUND

High bandwidth memory typically is a high-performance random-access memory (RAM) interface that includes a stack of dynamic random-access memory (DRAM) memory having through silicon vias (TSVs) through the DRAM stack. The high bandwidth memory is typically packaged in a specific configuration to enable the high bandwidth memory to be used by another device, such as, but not limited to a graphics card.

FIG. 6 shows a side view schematic of a prior semiconductor device assembly 400 that includes a plurality of hybrid memory cubes (HMC) 430 offered by Micron Technology of Boise, Id. The HMC includes multiple memory dies, usually four (4) to eight (8), stacked on top of each other and uses TSVs to interconnect the memory cells. The HMC includes a memory controller, which is integrated as a separate die. Microbumps on a bottom side of the HMC may be used to connect the HMC to another device, such as, but not limited to, a graphics card.

The semiconductor device assembly 400 includes a substrate, or printed circuit board (PCB), 410 having a first, or top, side 411 and a second, or bottom, side 412, which is opposite of the first side 411. A silicon interposer 420 is connected to the first side 411 of the substrate 410. The interposer 420 has a first, or top, side 421 and a second, or bottom, side 422, which is opposite of the first side 421. A plurality of interconnects 401 on the second side 412 of the substrate 410 may be used to connect the semiconductor device assembly 400 to another device as would be appreciated by one of ordinary skill in the art. The semiconductor device assembly 400 may include a plurality of interconnect elements (not shown) between each component of the semiconductor device assembly 400 as would be appreciated by one of ordinary skill in the art.

A GPU, or a CPU, 440 is connected directly to the first side 421 of the interposer 420. The semiconductor device assembly 400 includes at least one HMC 430. For example, four HMC's 430 may be connected to the semiconductor device assembly 400. However, the HMC's 430 are not connected directly to the first side 421 of the interposer 420. Rather, each HMC 430 is connected to an interface die 450. Then the assembly comprised of the HMC 430 and the interface die 450 is connected to the interposer 420. The semiconductor device assembly 400 requires a interface die 450 between each HMC 430 and the interposer 420 increasing the cost and/or complexity of the semiconductor device assembly 400.

Additional drawbacks and disadvantages may exist.

Figure 1:
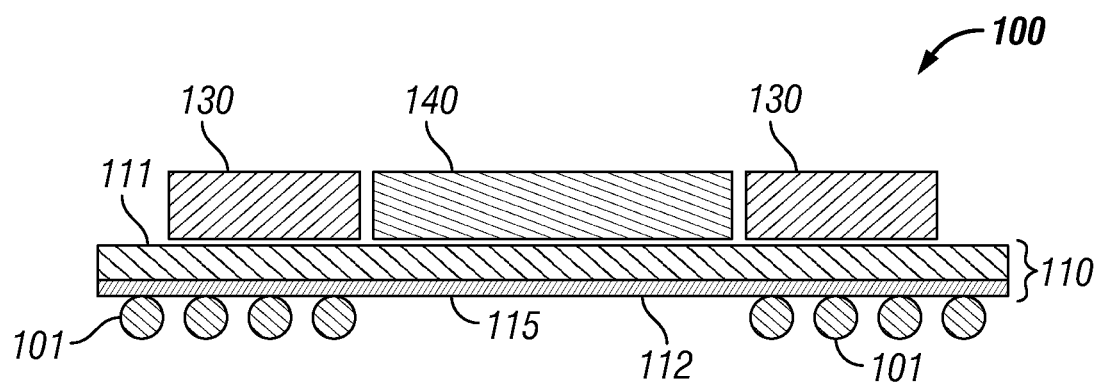
FIG. 1 is a side view schematic of an embodiment of a semiconductor device assembly.

While the disclosure is susceptible to various modifications and alternative forms, specific embodiments have been shown by way of example in the drawings and will be described in detail herein. However, it should be understood that the disclosure is not intended to be limited to the particular forms disclosed. Rather, the intention is to cover all modifications, equivalents and alternatives falling within the scope of the disclosure as defined by the appended claims.

DETAILED DESCRIPTION

In this disclosure, numerous specific details are discussed to provide a thorough and enabling description for embodiments of the present disclosure. One of ordinary skill in the art will recognize that the disclosure can be practiced without one or more of the specific details. Well-known structures and/or operations often associated with semiconductor devices and semiconductor device packages may not be shown and/or may not be described in detail to avoid obscuring other aspects of the disclosure. In general, it should be understood that various other devices, systems, and/or methods in addition to those specific embodiments disclosed herein may be within the scope of the present disclosure.

The terms "semiconductor device assembly" can refer to an assembly of one or more semiconductor devices, semiconductor device packages, and/or substrates, which may include interposers, supports, and/or other suitable substrates. The semiconductor device assembly may be manufactured as, but not limited to, discrete package form, strip or matrix form, and/or wafer panel form. The term "semiconductor device" generally refers to a solid-state device that includes semiconductor material. A semiconductor device can include, for example, a semiconductor substrate, wafer, panel, or a single die from a wafer or substrate. A semiconductor device may refer herein to a semiconductor die, but semiconductor devices are not limited to semiconductor dies.

As used herein, the terms "vertical," "lateral," "upper," and "lower" can refer to relative directions or positions of features in the semiconductor devices and/or semiconductor device assemblies shown in the Figures. For example, "upper" or "uppermost" can refer to a feature positioned closer to the top of a page than another feature. These terms, however, should be construed broadly to include semiconductor devices and/or semiconductor device assemblies having other orientations, such as inverted or inclined orientations where top/bottom, over/under, above/below, up/down, and left/right can be interchanged depending on the orientation.

Various embodiments of this disclosure are directed to semiconductor devices, semiconductor device assemblies, semiconductor packages, semiconductor device packages, and methods of making and/or operating semiconductor devices.

An embodiment of the disclosure is a semiconductor device assembly comprising a substrate having a first side and a second side, the substrate having a plurality of complementary metal-oxide-semiconductor (CMOS) circuits. The semiconductor device assembly includes a first semiconductor device connected directly to the first side of the substrate and a second semiconductor device connected directly to the first side of the substrate. The substrate is configured to enable the first semiconductor device and the second semiconductor device to communicate with each other through the substrate. The semiconductor device assembly includes a redistribution layer positioned on the second side of the substrate and a plurality of interconnects connected to the redistribution layer, wherein the redistribution layers enables a connection between the plurality of interconnects with at least the first semiconductor device. The first semiconductor device may be a processing unit, such as a graphics processor, and the second semiconductor device may be a memory device, such as a high bandwidth memory device.

An embodiment of the disclosure is a semiconductor device assembly comprising a silicon substrate having a first side and a second side, the silicon substrate having CMOS circuits and the first side including back end of line (BEOL) layers. The semiconductor device assembly includes a graphics processing unit (GPU) or a central processing unit (CPU) connected directly to the BEOL layers of the silicon substrate. The semiconductor device assembly includes a plurality of memory devices connected directly to the BEOL layers of the silicon substrate, wherein the GPU or CPU and the plurality of memory devices communicate with each other through the silicon substrate. The plurality of memory devices may be high bandwidth memory devices.

An embodiment of the disclosure is a method of making a semiconductor device assembly. The method comprises applying CMOS processing to a silicon substrate and forming BEOL layers on a first side of the silicon substrate. The method includes attaching a first semiconductor device directly to the BEOL layers and attaching a second semiconductor device directly to the BEOL layers. The method comprises forming a redistribution layer on a second side of the silicon substrate and attaching a plurality of solder balls to the redistribution layer. The first semiconductor device may be a processing unit, such as a graphics processor, and the second semiconductor device may be a memory device, such as a high bandwidth memory device. The plurality of solder balls enables the semiconductor device assembly to be connected to another device.

An embodiment of the disclosure is a method of making a semiconductor device assembly. The method comprises attaching a plurality of semiconductor devices onto a first side of a silicon wafer. The method includes attaching a plurality of individual graphics processing units onto the first side of the silicon wafer. The method includes creating a redistribution layer on a second side of the silicon wafer and attaching a plurality of interconnects to the redistribution layer on the second side of the silicon wafer. The method includes processing the silicon wafer to form a plurality of individual semiconductor device assemblies each comprising at least one semiconductor device and an individual graphics processing unit.

FIG. 1 is a side view schematic of an embodiment of a semiconductor device assembly 100. The semiconductor device assembly 100 includes a substrate 110 having a first, or top, side 111 and a second, or bottom, side 112, which is opposite of the first side 111. The substrate 110, may be, but is not limited to, a silicon substrate. The substrate 110 includes a backside redistribution layer 115, which provides electrical connections between the substrate 110 and a plurality of interconnects 101 on the second side 112 of the substrate 110. The plurality of interconnects 101 enables the semiconductor device assembly 100 to be connected to another device, such as, but not limited to, a graphics card.

A first semiconductor device 140 is connected directly to the first side 111 of the substrate 110. Likewise, a second semiconductor device 130 is connected directly to the first side 111 of the substrate 110. The first semiconductor device 140 may be a processing unit, such as, but not limited to, a GPU or a central processing unit (CPU). The second semiconductor device 130 may be a memory device. CMOS processing may have been applied to the substrate 110 to enable the substrate 110 to be configured to enable communication between the first semiconductor device 140 and the second semiconductor device 130 through the substrate 110. The CMOS processing on the substrate 110 creates CMOS transistor gates within the substrate 110 that function as a buffer for data transfer between the first semiconductor device 140, the second semiconductor device 130, and/or an external device connected to the semiconductor device assembly 100 via the plurality of interconnects 101. The CMOS transistor gates may also function as logic to control data transfer between the first semiconductor device 140, the second semiconductor device 130, and/or an external device connected to the semiconductor device assembly 100 via the plurality of interconnects 101.

In an embodiment, the second semiconductor device 130 may be, but is not limited to, a high bandwidth memory device. As used herein, a high bandwidth memory device is a stack of DRAM dies that optionally includes a base die with a memory controller that are interconnected by through silicon vias (TSVs) and having microbumps on a bottom side, a HMC offered by Micron Technology of Boise, Id., or the like.

Figure 2:
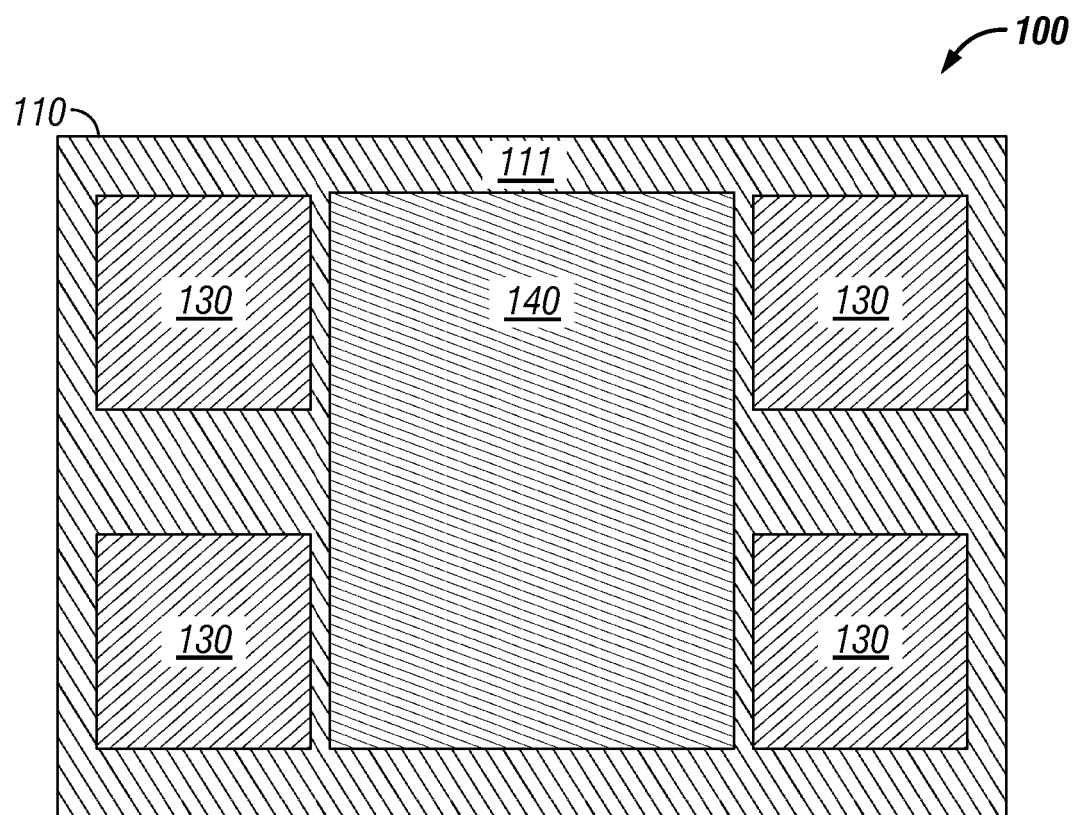
FIG. 2 is a top view schematic of an embodiment of a semiconductor device assembly.

FIG. 2 is a top view schematic of an embodiment of a semiconductor device assembly 100. The semiconductor device assembly 100 includes a substrate 110 having a first, or top, side 111. The substrate 110, may be, but is not limited to, a silicon substrate. A first semiconductor device 140 is connected directly to the first side 111 of the substrate 110. Likewise, a plurality of second semiconductor devices 130 are connected directly to the first side 111 of the substrate 110. The first semiconductor device 140 may be a processing unit, such as, but not limited to, a GPU and the second semiconductor devices 130 may be high bandwidth memory devices. CMOS processing may have been applied to the silicon substrate 110 to enable the substrate 110 to be configured to enable communication between the first semiconductor device 140 and the second semiconductor device 130 through the substrate 110.

Figure 3:
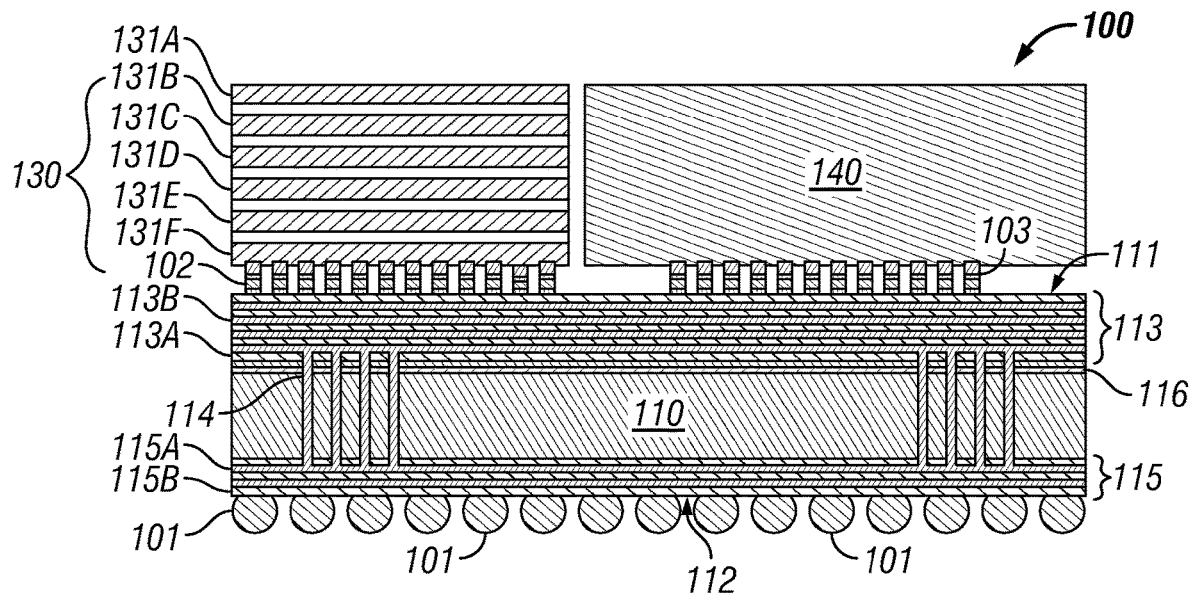
FIG. 3 is a cross-section view schematic of an embodiment of a semiconductor device assembly.

FIG. 3 is a cross-section view schematic of an embodiment of a semiconductor device assembly 100. The semiconductor device assembly 100 includes one or more high bandwidth memory devices 130. The high bandwidth memory device 130 is a stack of memory cells, or dies, 131A-131F that are electrically connected together as would be appreciated by one or ordinary skill in the art having the benefit of this disclosure. The number of memory cells 131A-131F is shown for illustrative purposes and may be varied depending on the application as would be appreciated by one of ordinary skill in the art. The high bandwidth memory device 130 is connected directly to a substrate 110 by a plurality of interconnects 102. A processing unit 140 is also connected directly to the substrate by a plurality of interconnects 103.

The substrate 110 may be a silicon substrate and includes a first, or top, side 111 and a second, or bottom, side 112. The substrate 110 may include a plurality of back-end-of-line (BEOL) layers 113 adjacent to the first side 111 of the substrate 110. The BEOL layers 113 may be may be comprised of alternating dielectric layers 113A and conductive layers 113B. The BEOL layers 113 provide routing layers within the substrate 110 and electrically connect the high bandwidth memory devices 130 and the processing unit 140 to a plurality of TSVs 114 that extend through the substrate 110 as would be appreciated by one of ordinary skill in the art.

The substrate 110 may include a backside redistribution layer 115 adjacent to the second 112 side of the substrate 110. The backside redistribution layer 115 may be comprised of alternating conductive layers 115A and dielectric layers 115B. The backside redistribution layer 115 electrically connects the high bandwidth memory devices 130 and the processing unit 140 to the plurality of interconnects 101 on the second side 112 of the substrate 110 as would be appreciated by one of ordinary skill in the art. The plurality of interconnects 101 on the second side 112 of the substrate 110 enable the semiconductor device assembly 100 to be connected to another device as would be appreciated by one of ordinary skill in the art having the benefit of this disclosure.

CMOS processing may be applied to the substrate 110 as discussed herein. CMOS processing may be applied to the substrate 110 as discussed herein as schematically indicated by CMOS layer 116. The CMOS layer 116 of the substrate 110 includes CMOS transistor gates as would be appreciated by one of ordinary skill in the art having the benefit of this disclosure. The size, shape, location, and/or configuration of the CMOS layer 116 is shown for illustrative purpose and may be varied as would be appreciated by one of ordinary skill in the art having the benefit of this disclosure.

Figure 4:
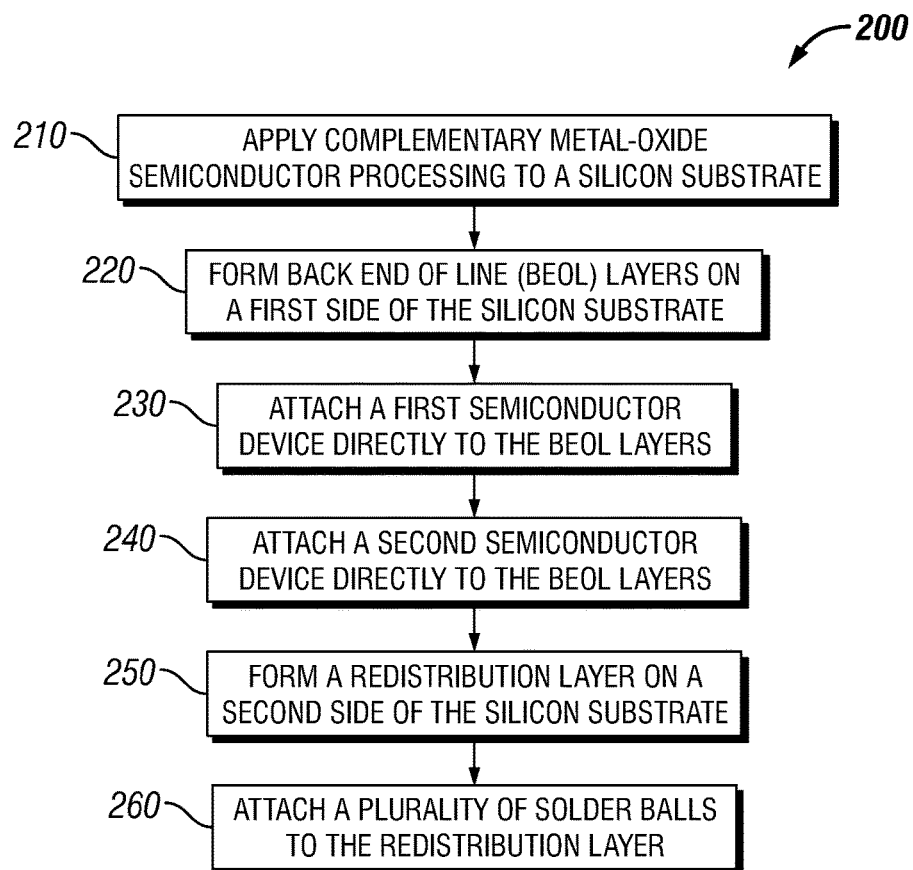
FIG. 4 is a flow chart of an embodiment of a method of making a semiconductor device assembly.

FIG. 4 is a flow chart of an embodiment of a method 200 of making a semiconductor device assembly. The method 200 comprises applying CMOS processing to a silicon substrate, at 210. The method 200 includes forming BEOL layers on a first side of the silicon substrate, at 220. At 230, the method 200 includes attaching a first semiconductor device directly to the BEOL layers of the substrate. The method 200 includes attaching a second semiconductor device directly to the BEOL layers of the substrate, at 240. The first semiconductor device may be a processing unit and the second semiconductor device may be a memory device, such as a high bandwidth memory device. The method 200 includes forming a redistribution layer on a second side of the silicon substrate, at 250, and attaching a plurality of solder balls to the redistribution layer, at 260.

Figure 5:
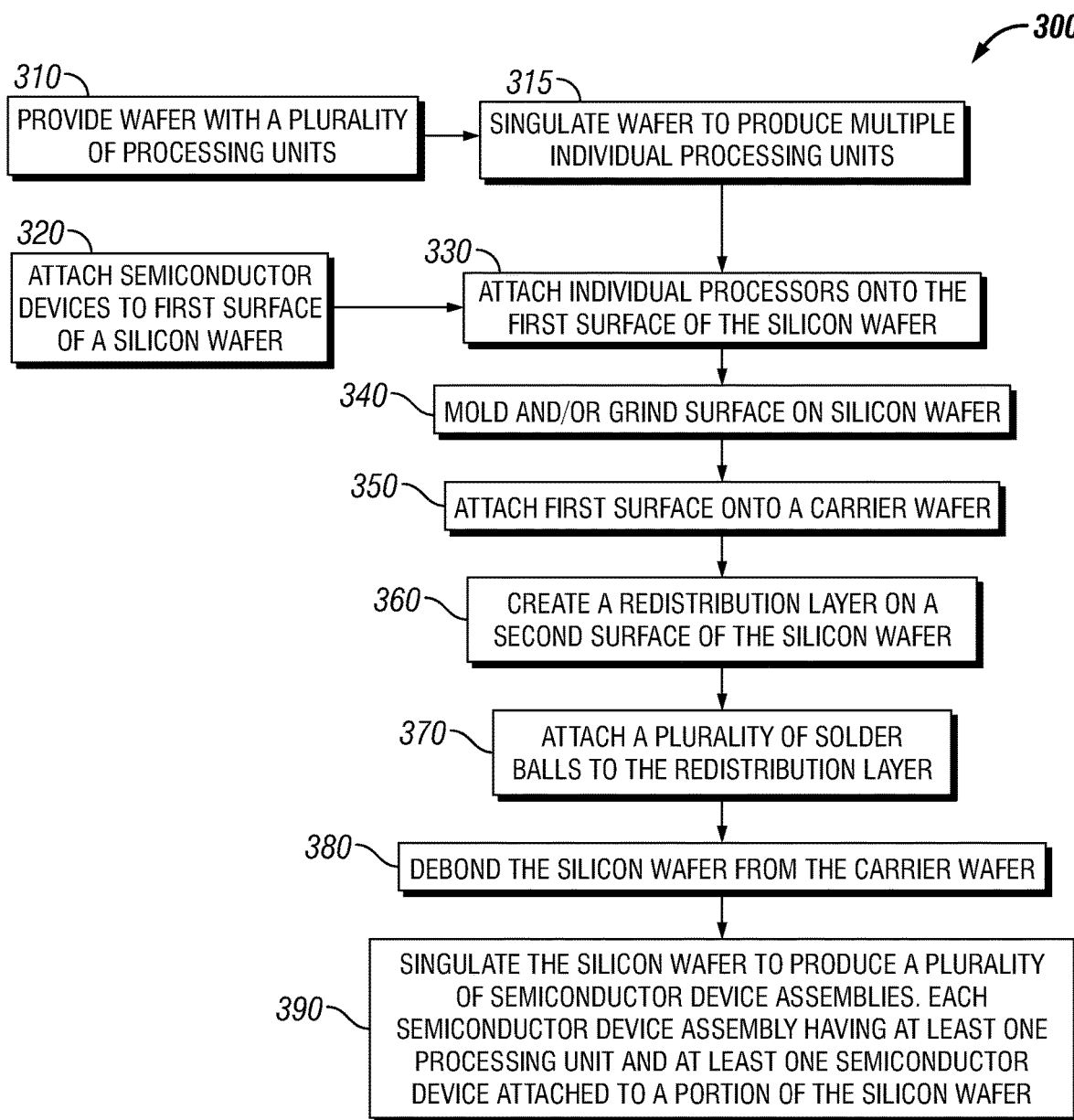
FIG. 5 is a flow chart of an embodiment of a method of making a semiconductor device assembly.
Figure 6:
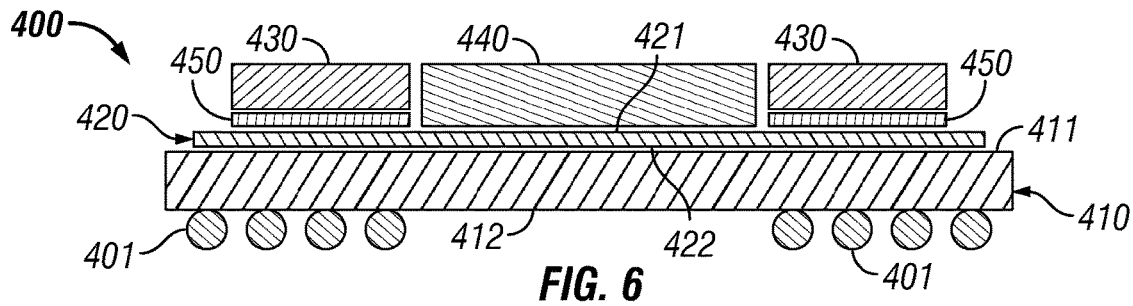
FIG. 6 is a side view schematic of a prior semiconductor device assembly.

FIG. 5 is a flow chart of an embodiment of a method 300 of making a semiconductor device assembly. The method 300 includes providing a wafer with a plurality of processing units attached to the wafer and singulating the wafer to produce multiple individual processing units, at 310. The processing units may be graphics processing units. At 320, the method 300 includes attaching a plurality of semiconductor devices onto a silicon wafer. The semiconductor devices may be memory devices and, in particular, may be high bandwidth memory devices. The method 300 includes singulating the wafer to produce multiple individual processing units, at 315. The method 300 includes attaching multiple individual processing units onto the first surface, or side, of the silicon wafer, at 330. The processing units are attached to the silicon wafer in conjunction with one or more semiconductor devices.

The method 300 includes molding and/or grinding portions of the silicon wafer, at 340, to better enable the attachment of solder balls to the portions of the substrate and/or for general silicon protection from outside stresses and/or environments. At 350, the method 300 includes attaching the first surface of the silicon wafer to a carrier wafer. The carrier wafer enables processing to be carried out on a second surface of the silicon wafer. The method 300 includes creating a redistribution layer on the second surface of the silicon wafer, at 360, and attaching a plurality of solder balls to the redistribution layer, at 370. The method 300 includes debonding the silicon wafer from the carrier wafer, at 380. The method 300 includes singulating the silicon wafer to produce a plurality of semiconductor device assemblies, each semiconductor device assembly having at least one processing unit and at least one semiconductor device attached to a portion of the silicon wafer, at 390. The semiconductor device assembly may then be connected to another device, such as, but not limited to, a graphics card.

The method 300 of making a semiconductor device assembly provides for the production of multiple semiconductor devices assemblies using fewer steps than present methods. The method 300 of making a semiconductor device assembly streamlines the process or the prior method of making a semiconductor device assembly as shown herein in regard to FIG. 7.

Figure 7:
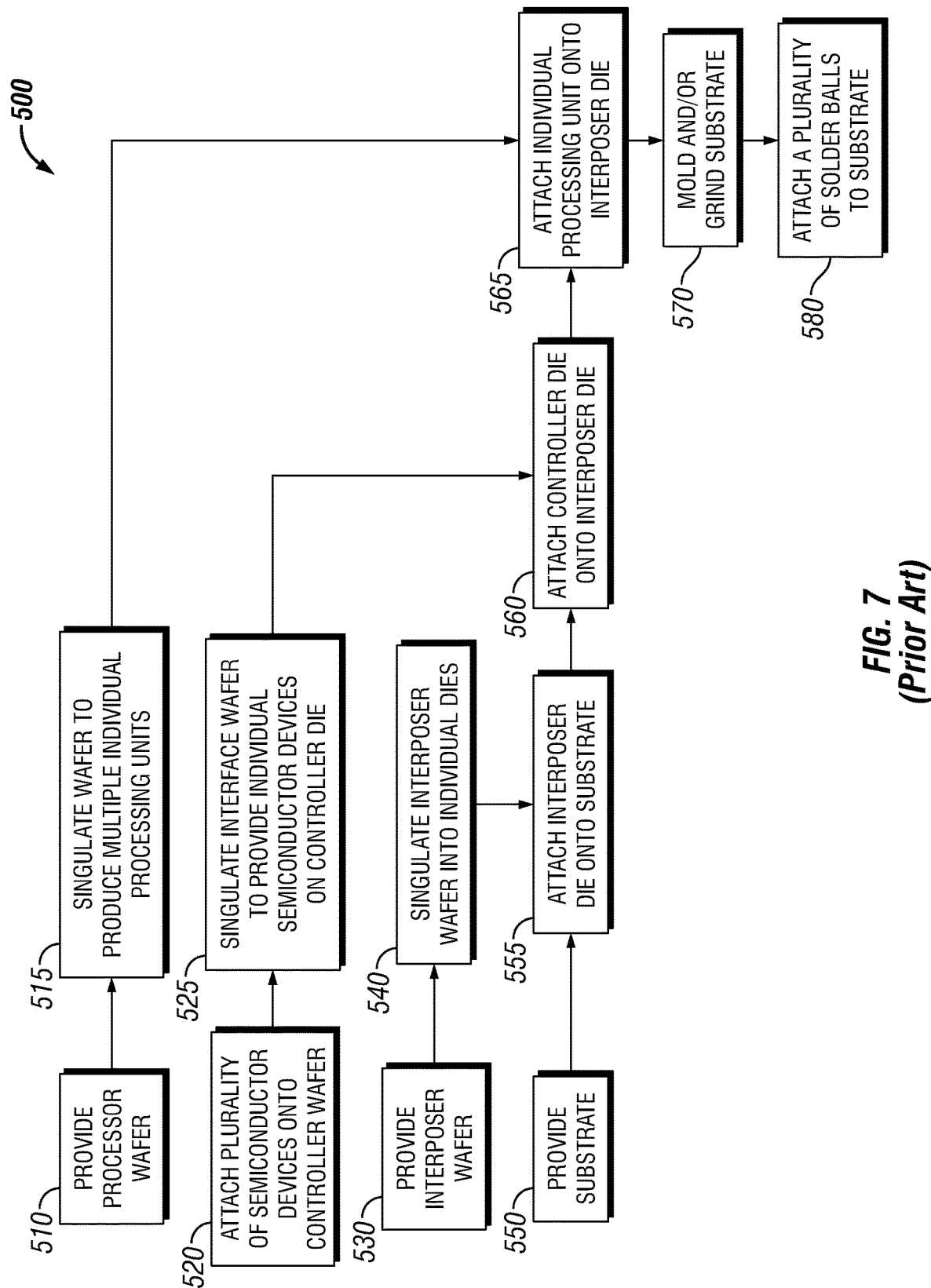
FIG. 7 is a flow chart of a prior method of making a semiconductor device assembly.

FIG. 7 is a flow chart of a prior method 500 of making a semiconductor device assembly. The method 500 includes providing a processor wafer, at 510, and singulating the processor wafer to produce multiple individual processing units, at 515. The method 500 requires attaching a plurality of semiconductor devices, such as high bandwidth memory devices, to a controller, or interface, wafer, at 520, and singulating the controller wafer to provides individual semiconductor devices attached to controller dies, at 525.

The method 500 includes providing an interposer wafer, at 530, and singulating the interpose wafer into individual dies, at 540. The method 500 includes providing a substrate, at 550, and attaching an interposer die onto the substrate, at 555. After, the interposer die is attached to the substrate, the Method 500 includes attaching a controller die, which has a semiconductor device attached to it, onto the interposer die, at 560. The semiconductor device assembly may include a plurality of semiconductor devices. Each semiconductor device is attached to the controller wafer, at 520, and will be attached to the controller die when the controller wafer is singulated, at 525. Each semiconductor device will then need to be attached to the interposer die via the attached controller die, at 560. The method 500 includes attaching an individual processing unit onto the interposer die, at 565. The method 500 includes molding and/or grinding portions of the substrate, at 370, to better enable the attachment of solder balls to the portions of the substrate and/or for general silicon protection from outside stresses and/or environments. The method 500 includes attaching a plurality of solder balls to the substrate, at 380. The semiconductor device assembly may then be connected to another device, such as, but not limited to, a graphics card.

Although this disclosure has been described in terms of certain embodiments, other embodiments that are apparent to those of ordinary skill in the art, including embodiments that do not provide all of the features and advantages set forth herein, are also within the scope of this disclosure. The disclosure may encompass other embodiments not expressly shown or described herein. Accordingly, the scope of the present disclosure is defined only by reference to the appended claims and equivalents thereof.

What is claimed is:

1. A semiconductor device assembly comprising:
 a substrate having a first side and a second side, the substrate having a plurality of complementary metal-oxide-semiconductor circuits;
 a first semiconductor device connected directly to the first side of the substrate;
 a second semiconductor device connected directly to the first side of the substrate, wherein the substrate is configured to enable the first semiconductor device and the second semiconductor device to communicate directly with each other through the substrate;
 a redistribution layer positioned on the second side of the substrate; and
 a plurality of interconnects connected to the redistribution layer, wherein the redistribution layer enables a connection between the plurality of interconnects with at least the first semiconductor device.

2. The semiconductor device assembly of claim 1, wherein the plurality of complementary metal-oxide-semiconductor circuits provide a buffer for data transfer between the first semiconductor device and the second semiconductor device.

3. The semiconductor device assembly of claim 2, wherein the plurality of complementary metal-oxide-semiconductor circuits provides logic to control data transfer between the first semiconductor device and the second semiconductor device.

4. The semiconductor device assembly of claim 1, wherein the substrate is a silicon substrate configured to connect the first semiconductor device and the second semiconductor device to the redistribution layer.

5. The semiconductor device assembly of claim 4, wherein the first semiconductor device is a processing unit.

6. The semiconductor device assembly of claim 5, wherein the processing unit further comprises a graphics processing unit (GPU) or a central processing unit (CPU).

7. The semiconductor device assembly of claim 6, wherein the second semiconductor device is a memory device.

8. The semiconductor device assembly of claim 7, wherein the memory device further comprises a high bandwidth memory device.

9. The semiconductor device assembly of claim 1, further comprising a third semiconductor device connected directly to the first side of the silicon substrate, wherein the third semiconductor device is a memory device and wherein the first semiconductor device and the third semiconductor device communicate with each other through the silicon substrate.

10. The semiconductor device assembly of claim 1, wherein the first side of the substrate comprises back end of line (BEOL) layers and wherein the first and second semiconductor devices are connected directly to the BEOL layers.

11. The semiconductor device assembly of claim 10, comprising a plurality of vias through the substrate, wherein the plurality of vias electrically connect the BEOL layers to the redistribution layer.

12. A semiconductor device assembly comprising:
 a silicon substrate having a first side and a second side, the silicon substrate having complementary metal-oxide-semiconductor circuits and the first side includes back end of line (BEOL) layers;
 a graphics processing unit (GPU) or central processing unit (CPU) connected directly to the BEOL layers of the silicon substrate; and
 a plurality of memory devices connected directly to the BEOL layers of the silicon substrate, wherein the GPU or CPU and the plurality of memory devices communicate directly with each other through the silicon substrate.

13. The semiconductor device assembly of claim 12, wherein the complementary metal-oxide-semiconductor circuits provide a buffer for data transfer between the GPU or CPU and the plurality of memory devices.

14. The semiconductor device assembly of claim 12, wherein the plurality of memory devices comprises at least two high bandwidth memory devices.

15. The semiconductor device assembly of claim 12, comprising a redistribution layer on the second side of the silicon substrate, the redistribution layer being connected to a plurality of solder balls.

16. The semiconductor device assembly of claim 15, further comprising at least one via through the silicon substrate, the at least one via electrically connecting the BEOL layers to the redistribution layer.

* * * * *